United States Patent
Kasperkovitz et al.

[11] Patent Number: 5,929,678
[45] Date of Patent: Jul. 27, 1999

[54] FREQUENCY SYNTHESIS CIRCUIT HAVING A CHARGE PUMP

[75] Inventors: Wolfdietrich G. Kasperkovitz; Cicero S. Vaucher, both of Eindhoven, Netherlands

[73] Assignee: U.S. Philips Corporation, New York, N.Y.

[21] Appl. No.: 08/923,048

[22] Filed: Sep. 3, 1997

[30] Foreign Application Priority Data

Sep. 6, 1996 [EP] European Pat. Off. ............. 96202486

[51] Int. Cl.$^6$ .......................... H03L 5/093; H03K 17/00
[52] U.S. Cl. ...................... 327/157; 327/148; 327/156; 327/105; 327/537; 327/536; 331/17; 331/25
[58] Field of Search ................... 327/156, 157, 327/105, 536, 537, 538, 148, 147, 141; 331/8, 17, 25

[56] References Cited

U.S. PATENT DOCUMENTS

| | | | |
|---|---|---|---|
| 5,208,546 | 5/1993 | Nagaraj et al. | 327/157 |
| 5,493,250 | 2/1996 | Kasperkovitz et al. | 327/563 |
| 5,610,954 | 3/1997 | Miyashita et al. | 327/157 |

FOREIGN PATENT DOCUMENTS

0519562A2  6/1992  European Pat. Off. .

OTHER PUBLICATIONS

SP24.5 by Akbar Ali and Joo Leong Tham, entitled "A 900 MHz Frequency synthesizer with integrated LC voltage-controlled oscillator", 1996 IEEE International Solid-State Circuits Conference, pp. 390–391.

*Primary Examiner*—Dinh Le
*Attorney, Agent, or Firm*—Edward W. Goodman

[57] ABSTRACT

A charge pump (CP) is provides for supplying at its output (23) a first current in response to an up-pulse and sinking a second current in response to a down pulse. This charge pump includes a first circuit 200, 22, CM1) for converting the first control signal into the first current, and a second circuit (206, 208, CM2) for converting the second control signal into the second current, said the first and second circuits include circuitry means comprising means (CM1, CM2) for filtering the respective control signals. It is recognized that a charge pump does not have to supply or sink current pulses which are rectangularly shaped in order for it to properly carry out its function. In the subject charge pump invention, the current sources supply or sink current pulses are smoothly shaped because the control signals supplied to the current sources are filtered. This causes the demands on the high frequency performance of the current sources to be greatly reduced. Consequently, relatively slow current sources may be used without the performance of the charge pump being limited by these slow current sources.

10 Claims, 3 Drawing Sheets

CP

FREQUENCY SYNTHESIS CIRCUIT HAVING A CHARGE PUMP

BACKGROUND OF THE INVENTION;

1. Field Of The Invention;

The invention relates to a charge pump for supplying at an output a first current in response to a first control signal and sinking at the output a second current in response to a second control signal.

The invention also relates to a frequency synthesis circuit comprising a charge pump.

The invention further relates to a receiver comprising such a frequency synthesis circuit 2. Description Of The Related Art;

A charge pump according to the preamble is known from the document SP24.5 by Akbar Ali and Joo Leong Tham, entitled "A 900 MHz Frequency synthesizer with integrated LC voltage-controlled oscillator", 1996 IEEE International Solid-State Circuits Conference, p. 390–391. The known charge pump is a building block of a phase-locked loop for sourcing a current in response to an up-signal, and sinking a current in response to a down-signal, the current being supplied to a loop filter. In the known charge pump, the up-and down-signals (also called first and second control signals) operate switched current sources. As the switched current sources are placed in cascode, the current sources are customarily implemented using transistors of a different conductivity type. As transistors of different conductivity have different properties, such as a transition frequency $f_T$, this results in an asymmetric behavior of the charge pump. For example, the first switched current source usually comprises PNP transistors and the second current source usually comprises NPN transistors. In standard IC technology, the PNP transistors are notorious for their relatively poor high frequency performance and, consequently, they cannot be used at the same high frequency as NPN transistors with the same performance. In the known charge pump, this problem is solved by matching the high frequency performance of the NPN current sources with the high frequency performance of the PNP current source. This is done by placing a capacitor parallel to the NPN current source to reduce the high frequency performance of the NPN current source. As a consequence, the maximum frequency of the up- and down-pulses is restricted.

SUMMARY OF THE INVENTION

It is an object of the invention to provide a charge pump with improved symmetry, which can be used at higher pulse frequencies than hitherto possible.

A charge pump according to the invention is characterized in that the charge pump comprises first means for converting the first control signal into the first current and second means for converting the second control signal into the second current, said first and second means comprising means for filtering the respective control signals.

The invention is based on the recognition that a charge pump does not have to supply or sink current pulses which are rectangularly shaped in order for it to properly carry out its function. In the invention, the current sources supply or sink current pulses are smoothly shaped because the control signals supplied to the current sources are filtered. This causes the demands on the high frequency performance of the current sources to be greatly reduced. Consequently, relatively slow current sources may be used without the performance of the charge pump being limited by these slow current sources.

An embodiment of the charge pump according to the invention is characterized in that the first and second means comprise respective low-pass filters for filtering the respective control signals, the respective filtered control signals being supplied to respective controlled current sources.

In this embodiment, first the filtering takes place, followed by a voltage-to-current conversion. These measures enable simple controlled current sources to be used and do not impose severe demands on their high frequency performance.

An embodiment of the charge pump according to the invention is characterized in that the first and second means comprise respective means for converting the respective control signals into respective control currents, said respective control currents being applied to respective low-pass current filters, the output signals of the low-pass current filters being subtracted from each other at the output of the charge pump.

This provides an alternative in which first a voltage-to-current conversion is realized followed by filtering.

A further embodiment of the charge pump according to the invention is characterized in that the first means comprises a first differential pair for converting a first control signal, applied to the inputs of the first differential pair, into a current, said current being supplied to a first current mirror, and in that the second means comprises a second differential pair for converting the second control signal, applied to the inputs of the second differential pair, into a current, said current being supplied to a second current mirror, an output of the second current mirror being coupled to an output of the first current mirror via a third current mirror.

This is a simple embodiment of a charge pump in accordance with the invention.

An embodiment of the charge pump according to the invention is characterized in that the first and second differential pairs and the third current mirror comprise transistors of a first conductivity type, and the first and second current mirrors comprise transistors of a second conductivity type.

By using slow transistors of the second conductivity type for the first and second current mirrors, these current mirrors behave as low-pass current filters. As the transistors of the first conductivity type are fast transistors, the high frequency behavior of the charge pump is dominated by the behavior of the current mirrors used as low-pass current filters. By using slow current mirrors for realizing the first and the second currents, a good symmetrical behavior of the charge pump is achieved.

An embodiment of the charge pump according to the invention is characterized in that the charge pump comprises first and second capacitances placed parallel to respective inputs of the current mirrors.

By arranging capacitances so as to be parallel with the inputs of the current mirrors, the low-pass behavior will be determined by the combination of the capacitance value and the impedance at the input of the current mirror. As this impedance is a function of the current applied to the input of the current mirror, a low-pass current filter is obtained having a cut-off frequency which is proportional to the current flowing through the current mirror. This is a very desirable feature in phase-locked loops, wherein a small loop bandwidth is desired for an in-lock situation where only small phase errors occur, resulting in low current values being supplied by the charge pump, and a large loop bandwidth is desired in an out-of-lock situation for frequency changes, resulting in high current values being supplied by the charge pump.

An embodiment of the charge pump according to the invention is characterized in that the charge pump comprises respective cascades of current mirrors for realizing a high order filter characteristic, each cascade comprising current mirrors of an alternating conductivity type.

By adding more slow current mirrors, the order of the resulting low-pass filter can be increased. For each slow current mirror added, as well to couple the slow current mirror to the following slow current mirror (or the output of the charge pump), a fast current mirror needs to be added.

BRIEF DESCRIPTION OF THE DRAWINGS

These other objects of the invention will be apparent from and elucidated with reference to the drawings described hereinafter.

In the drawings.

DESCRIPTION OF THE PREFERRED EMBODIMENTS

Figure 1:
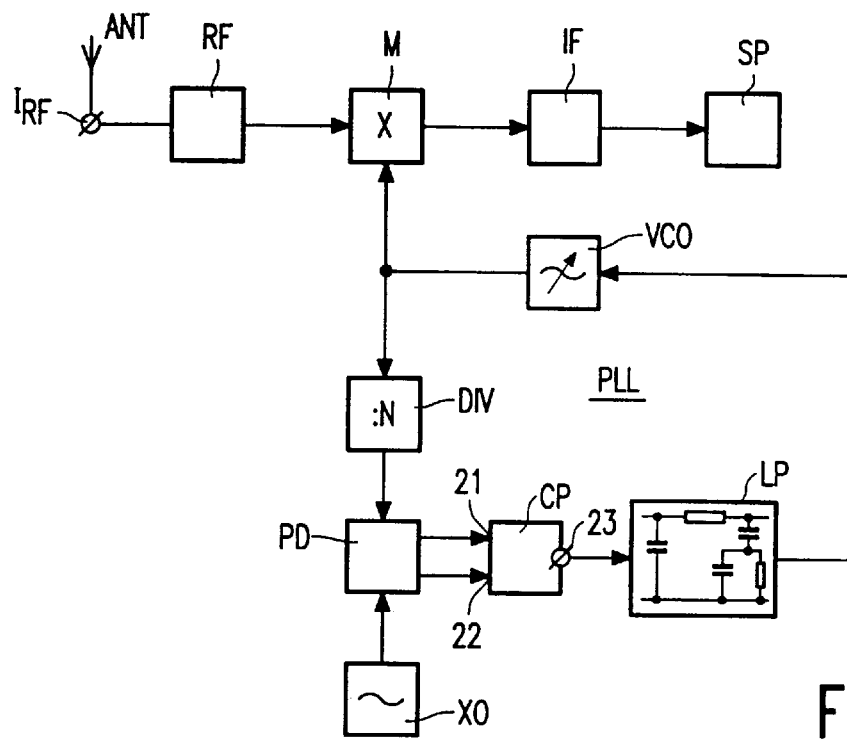
FIG. 1 shows a known receiver, having an RF antenna input $I_{RF}$ for coupling an RF antenna ANT thereto.

FIG. 1 shows a known receiver, having an RF antenna input $I_{RF}$ for coupling an RF antenna ANT thereto. Such a receiver is known from European Patent Application EP-A 519,562, corresponding to U.S. Pat. No. 5,221,91. An RF input section RF, a mixer stage M, an intermediate frequency circuit/demodulator unit IF and a baseband signal processing and reproducing device SP successively coupled to the RF antenna input $I_{RF}$ in the receiver. A mixing frequency or a local mixing carrier is applied to the mixer stage M from a frequency synthesis circuit, which this local mixing carrier being is tunable to a tuning frequency which deviates over an intermediate frequency from a desired transmitter frequency. With the aid of this local mixing carrier, it is possible to convert a desired RF reception signal, which is applied to the mixer stage M via the antenna ANT and the RF input section RF, into an intermediate frequency (IF) signal on an IF carrier, for example, of 10.7 MHz. In the IF circuit/demodulator unit IF, said IF signal is demodulated after IF selection and amplification, which results in a baseband signal. This baseband signal is subsequently further processed and reproduced in known manner in the baseband-signal processing and reproducing device SP.

The frequency synthesis circuit comprises a phase-locked loop PLL which incorporates a controlled oscillator VCO, an output of which is coupled to a phase detector PD of a phase detection device via a frequency divider circuit DIV. The frequency divider circuit DIV divides the frequency of the output signal of the controlled oscillator VCO by a controllable division factor N. A reference frequency $f_{ref}$ is applied to the phase detector PD from a crystal oscillator XO. The phase detection device also includes a charge pump CP, functioning as a voltage-current converter, which is coupled to the output of the phase detector PD and converts voltage pulses occurring in the output signal of the phase detector PD into current pulses. These current pulses are supplied by the charge pump CP to a current output 23 of the phase detection device which is coupled to a loop filter LP. The loop filter LP realizes a substantially noiseless conversion of the pulsatory output current signal at the current output 23 into a varying DC control voltage and a selection thereof without jeopardizing the loop stability. This control voltage is applied to a control input of the controlled oscillator VCO for controlling the frequency and/or phase of the oscillator signal. Pulses applied to input 21 of the charge pump CP result in an increase of the voltage supplied to the voltage controlled oscillator VCO and pulses applied to input 22 result in a decrease of the voltage supplied to the voltage controlled oscillator VCO. In this way, the signal applied to input 21 can be regarded as an up-signal for increasing the frequency of the voltage controlled oscillator VCO and the signal applied to input 22 can be regarded as a down-signal for reducing the frequency of the voltage controlled oscillator VCO.

In the operating range of the phase-locked loop PLL, the frequency and phase differences between the reference frequency $f_{ref}$ and the oscillator frequency of the controlled oscillator VCO divided by means of the division factor N of the frequency divider circuit DIV are negatively fed back. As a result, a phase synchronization is eventually obtained after a frequency synchronization, with the phase of said frequency-divided oscillator frequency of the controlled oscillator VCO being controlled so as to be accurately equal to that of the reference frequency $f_{ref}$ in the phase-locked state of the phase-locked loop PLL. The controlled oscillator VCO then supplies an oscillator frequency which is N times the reference frequency $f_{ref}$. Since the factor N is controllable, the oscillator signal, applied as a mixing frequency to the mixer stage M by the oscillator VCO, can be tuned to a desired tuning frequency by varying this factor N. The loop filter LP in the known receiver only uses passive elements and comprises a π-shaped RC network. This loop filter LP is not only responsible for the required current-to-voltage conversion, but also for a suppression of the frequencies applied to the phase detector PD and their harmonics, which may break through to the outputs of the phase detector PD. For these purposes, the loop filter LP requires several external components and in an integrated circuit, this filter normally requires two pins to connect the loop filter LP to the integrated parts of the phase-locked loop PLL.

Figure 2:
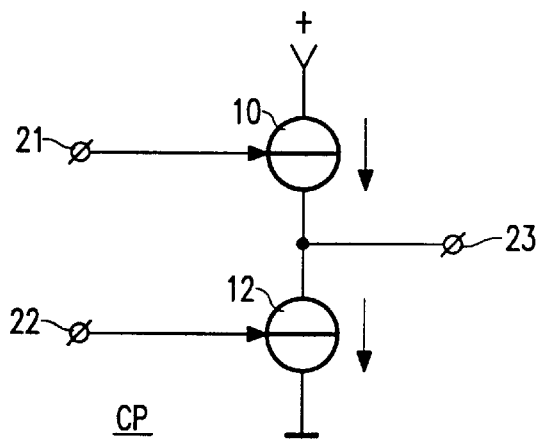
FIG. 2 shows a diagram of a known charge pump for use in the receiver of FIG. 1.

FIG. 2 shows a diagram of a known charge pump for use in the receiver of FIG. 1. The charge pump CP comprises a first controlled current source 10 supplying a switched current to output 23 in response to a first control signal applied to a first control input 21, and a second controlled current source 12 sinking a switched current in response to a second control signal applied to a second control input 22. In this way, pulses applied to respective control inputs result in current pulses at the output 23. The first control signal may be an up-signal indicating that the voltage applied to the VCO must be increased, as $f_{ref}$ is larger than the VCO frequency, and the second control signal may be a down-signal indicating that the voltage applied to the VCO must be decreased, as $f_{ref}$ is smaller than the VCO frequency. The resulting current pulses are then converted into a filtered voltage with the aid of the loop filter LP as shown in the receiver of FIG. 1. For very high frequencies of the pulses in the control signals, the controlled current sources must be very fast, i.e., turning on and off must be possible in a very short time. However, in integrated circuits, the first controlled current source 10 normally comprises PNP transistors. A well-known drawback of PNP transistors is that these transistors are substantially slower than NPN transistors. This means that the PNP current sources cannot switch on and off quickly enough to follow the voltage pulses in the control signals. The NPN transistors normally used for realizing controlled current source 12 can however switch on and off quickly enough at frequencies higher than those allowed for the PNP transistors. Consequently, at such high frequencies, the behavior of the charge pump CP becomes asymmetrical. This sets a limit to the maximum repetition rate of the pulses in the first and second control signals. It is alternatively possible to reduce the high frequency performance of the NPN current source so as to match the behavior of the slow PNP current source. This is known from the document SP24.5 by Akbar Ali and Joo Leong Tham, entitled "A 900 MHz Frequency synthesizer with integrated LC voltage-controlled oscillator", 1996 IEEE International Solid-State Circuits Conference, p. 390–391. However, if this technique is applied, the phase detector PD will not be able to correctly process input signals which have a relatively high frequency. Furthermore, the achieved matching of the NPN current source with the PNP current source may not be accurate enough, as integrated capacitances are susceptible to a large spread in capacitance value.

Figure 3:
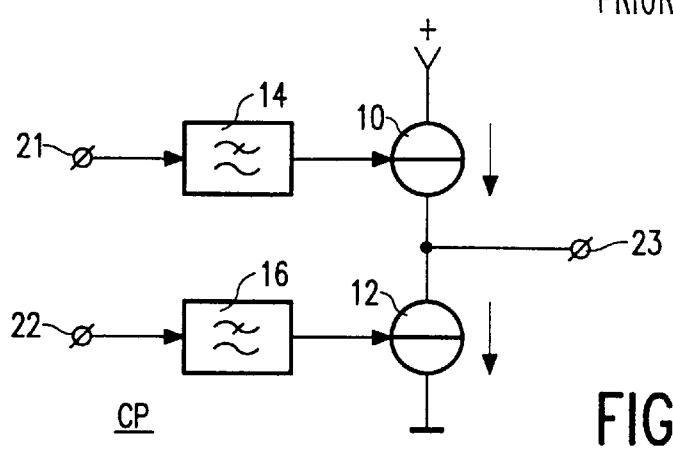
FIG. 3 shows a diagram of a first embodiment of a charge pump according to the present invention.

FIG. 3 shows a diagram of a first embodiment of a charge pump according to the present invention. A first low-pass filter 14 is coupled between the first control input 21 and a control input of the first controlled current source 10. A second low-pass filter 16 is coupled between the second control input 22 and a control input of the second controlled current source 12. This means that the first and second controlled current sources 10 and 12 are now controlled current sources supplying/sinking currents so as to be proportional to the output signals of the respective low-pass filters 14 and 16, and —due to the presence of the low-pass filters —no longer need to be able to switch on and off very fast. At very high input frequencies this results in smoothed currents being supplied by the current sources 10 and 12 to the output 23. Through these measures, the input frequencies to the phase detector can be increased significantly and relatively slow PNP transistors can be used in the current sources. Furthermore, as a consequence of the ability of the charge pump CP to deal with increased input frequencies, the pulse width of the pulses supplied by the phase detector PD may now be reduced without the risk that the slow PNP transistors are not able to follow such short pulses, as these pulses are filtered before being applied to such PNP transistors. An advantage of a reduction of the width of the current pulses is that it results in reduced current shot noise in the phase-locked loop PLL. An additional advantage of incorporating the two low-pass filters 14 and 16 in the charge pump CP is that these low-pass filters 14 and 16 can be designed for suppression of breakthrough of pulse frequencies from either one of the inputs of the phase detector PD to the output 23 of the charge pump CP by selecting appropriate cut-off frequencies for these low-pass filters. As a consequence of this measure, the complexity of the loop filter LP may be reduced as this filter now only needs to provide the current-to-voltage conversion and no further suppression. In this case, the loop filter LP may be constructed as a two-port filter, requiring in an integrated circuit, only one pin for connection of the loop filter LP to the phase-locked loop PLL, whereas prior-art loop filters are normally (at least) three-port filters requiring two pins for connection to the phase-locked loop PLL (see for example, EP-A-0 519 562). Thus, by shifting part of the loop filter LP to the charge pump CP and dividing this part in two for filtering of respective control signals, an improved charge pump CP is realized. These advantages are in effect, reached by providing first means for converting the first control signal into a first current supplied to the output, and second means for converting the second control signal into a second current sunk at the output, said first and second means comprising means for filtering the respective control signals. This filtering is done directly with the first and second control signals (by low-pass filters 14 and 16 placed in front of controlled current sources 10 and 12, respectively), but may also be done following a voltage-to-current conversion of the first and second control signals, as is illustrated in FIGS. 4 and 5.

Figure 4:
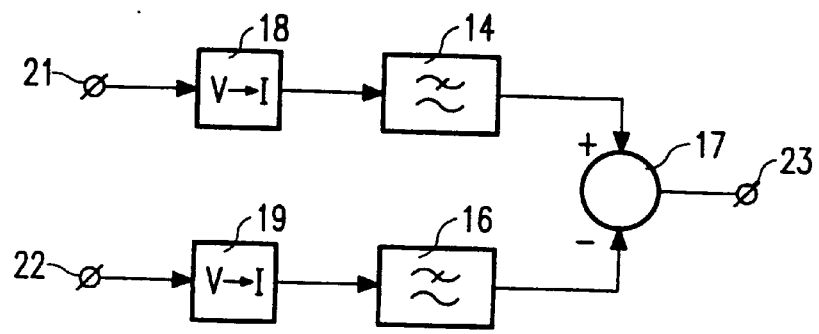
FIG. 4 shows a diagram of a second embodiment of a charge pump according to the invention.

FIG. 4 shows a diagram of a second embodiment of a charge pump according to the invention. The input 21 is coupled to a first voltage-to-current converter 18, which is coupled to the low-pass filter 14. The input 22 is coupled to a second voltage-to-current converter 19, which is coupled to the second low-pass filter 16. The outputs of the low-pass filters 14 and 16 are then coupled to a subtracting means 17 in which the output signal of the first low-pass filter 14 is subtracted from the output signal of the second low-pass filter 16. An output of the subtracting means 17 is coupled to the output 23 of the charge pump CP. The voltage-to-current converters 18 and 19 convert pulses received at their respective inputs into respective current pulses.

Figure 5:
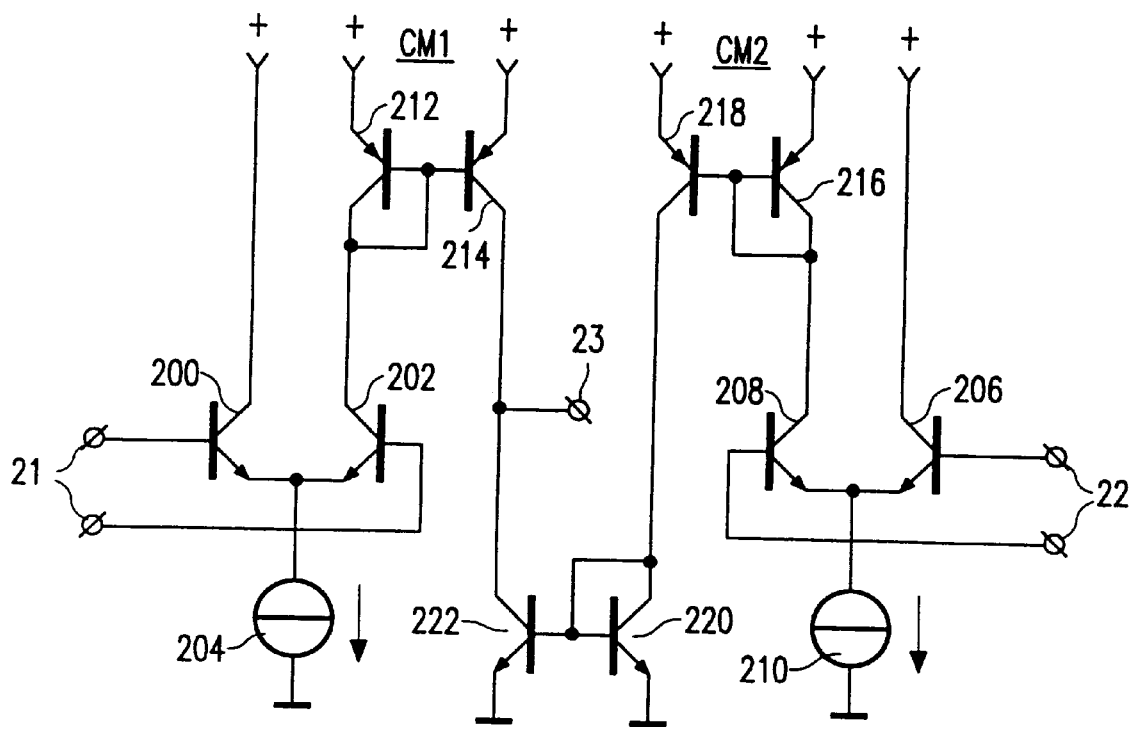
FIG. 5 shows a diagram of a third embodiment of a charge pump according to the invention.

FIG. 5 shows a diagram of a third embodiment of a charge pump according to the invention. The first voltage-to-current converter 18 of FIG. 4 is implemented by a first differential pair of transistors 200 and 202 with a tail current source 204 and the second voltage-to-current converter 19 is implemented by a second differential pair of transistors 206 and 208 with a tail current source 210. The bases of transistors 200 and 202 form a symmetrical input 21 for receiving a symmetrical first control signal. The bases of transistors 206 and 208 form a symmetrical input 22 for receiving a symmetrical second control signal. The charge pump CP further comprises a first current mirror CM1 having an input coupled to the collector of transistor 202 and an output coupled to the output 23 of the charge pump CP. A second current mirror CM2 has an input coupled to the collector of transistor 208 and an output coupled to an input of a third current mirror CM3. Preferably, the current mirrors CM1 and CM2 are closely matched for increased symmetry. An output of the third current mirror CM3 is coupled to the output 23 of the charge pump CP. By coupling the outputs of the first and third current mirrors CM1 and CM3 to the output 23, a subtraction of currents is achieved. A pulse applied to input 21 causes a current to flow through transistor 202, this current being mirrored to the output 23 by current mirror CM1. A pulse applied to input 22 causes a current to flow through transistor 208, this current being mirrored to the output 23 by the cascade of current mirrors CM2 and CM3 resulting in the current being sunk at the output 23. The first and second current mirrors CM1 and CM2 each comprise two PNP transistors 212, 214 and 216, 218, respectively. The collector of transistor 212 forms the input of the current mirror CM1 and is coupled to the bases of transistors 212 and 214. The collector of transistor 214 forms the output of the current mirror CM1. The emitters of transistors 212 and 214 are coupled to a positive power supply terminal. The collector of transistor 216 forms the input of the current mirror CM2 and is coupled to the bases of transistors 216 and 218. The collector of transistor 218 forms the output of the current mirror CM2. The emitters of transistors 216 and 218 are coupled to the positive power supply terminal. The third current mirror CM3 comprises NPN transistors 220 and 222, the collector of transistor 220 being coupled to the bases of transistors 220 and 222 and forming the input of the third current mirror CM3 and the collector of transistor 222 forming the output of the third current mirror CM3. As current mirrors CM1 and CM2 comprise slow PNP transistors, these current mirrors constitute a low-pass current filter for the pulses applied to inputs 21 and 22. The output current of the second current mirror CM2 is then fed to a third fast current mirror CM3, from where it is applied to the output 23. The third current mirror CM3 is called a fast current mirror, because NPN transistors normally have a cut-off frequency which lies several orders of magnitude higher than the cut-off frequency of PNP transistors. This means that the low-pass behavior of the cascaded current mirrors CM2 and CM3 is effectively dominated by the slow PNP current mirror CM2. Thus, pulses of the first control signal will result in a first filtered current supplied to the output 23, and pulses of the second control signal will result in a second filtered current sunk at the output 23, said first and second currents being proportional to the filtered first and second control signals, respectively. Since, for the voltage-to-current conversion, two identical differential pairs are, used of the same conductivity type, there will be hardly any difference in behavior between the current generated in response to the first control signal and the current generated in response to the second control signal. This symmetry is further enhanced by using a PNP current mirror in both branches, i.e., for filtering both up- and down-pulses. By using slow PNP current mirrors as low-pass filters 14 and 16, these low-pass filters can be fully integrated without using any external components. Now it is even possible to use the charge pump at input frequencies above the transition frequency $f_T$ of the PNP transistors.

Figure 6:
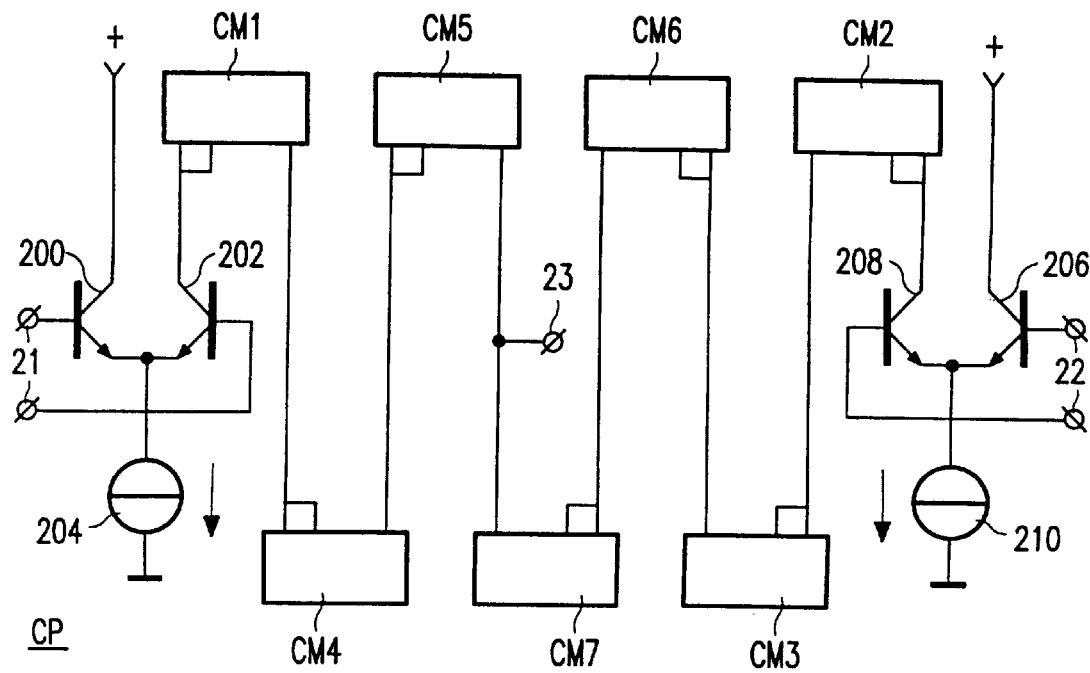
FIG. 6 shows a diagram of a fourth embodiment of a charge pump according to the invention.

FIG. 6 shows a diagram of a fourth embodiment of a charge pump according to the invention. The charge pump CP of FIG. 6 differs from the charge pump of FIG. 5 in that between the output of current mirror CM1 and the output 23, a cascade of NPN current mirror CM4 and PNP current mirror CM5 is inserted, and in that between the output of current mirror CM3 and the output 23, a cascade of PNP current mirror CM6 and NPN current mirror CM7 is inserted. Each PNP current mirror adds a low-pass filter to the charge pump CP. As the PNP current mirrors are dominant in the transfer characteristic as compared to the NPN current mirrors, these can be added to the charge pump without affecting the transfer characteristic of the combined current mirrors. By varying the number of PNP current mirrors, the order of the resulting low-pass filters is varied. For example, in FIG. 6 the low-pass filter 14 is realized with PNP current mirrors CM1 and CM5, resulting in a second order low-pass filter. The low-pass filter 16 is realized with PNP current mirrors CM2 and CM6, also resulting in a second order low-pass filter.

Figure 7:
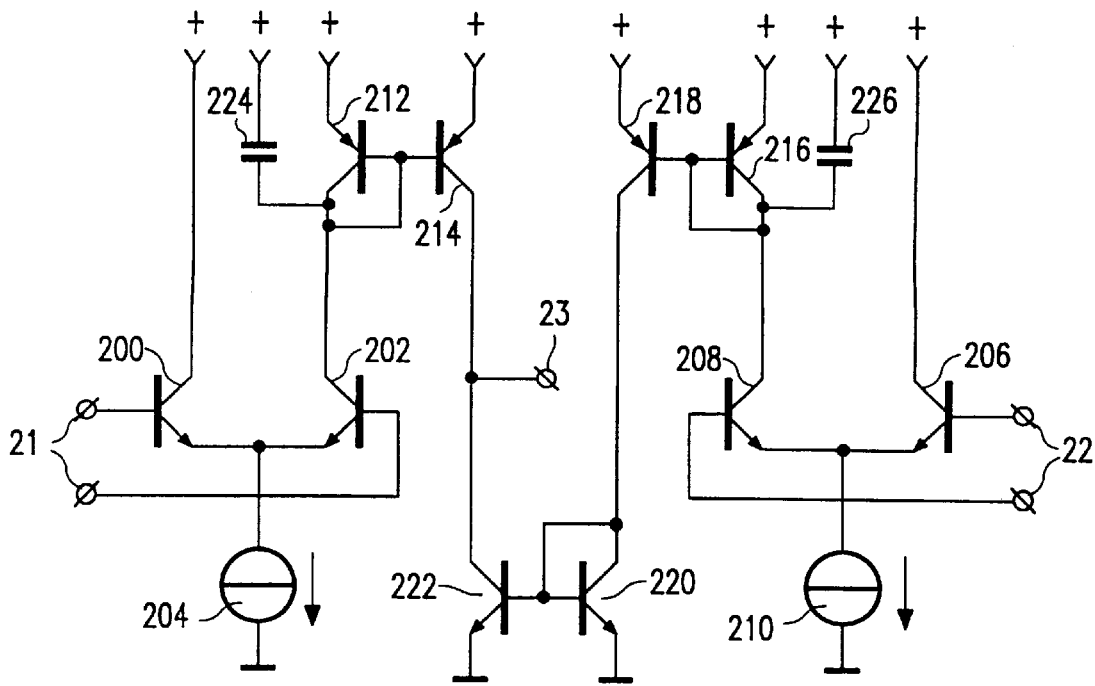
FIG. 7 shows a diagram of a fifth embodiment of a charge pump according to the invention. In the figures, identical parts bear the same reference numerals.

FIG. 7 shows a diagram of a fifth embodiment of a charge pump according to the invention. FIG. 7 differs from FIG. 5 in that a first capacitance 224 is coupled parallel to the input of the first PNP current mirror CM1 and a second capacitance 226 is coupled parallel to the input of the second current mirror CM2. The bandwidth of a phase-locked loop is determined, inter alia, by the bandwidth of the loop filter LP. As described previously, a part of the loop filter may be shifted to other elements in the phase locked loop, for example, the charge pump. When designing a phase-locked loop, some specifications contradict each other. For example, when a frequency change is made, the PLL should respond rapidly to this change and rapidly adjust the VCO frequency to the new reference frequency. This requires a large bandwidth. However, in in-lock situation, a large loop bandwidth also means a large noise bandwidth and results in a noisy VCO frequency. Furthermore, a large loop bandwidth results in less suppression of harmonics of the reference frequency $f_{ref}$. In summary: for in-lock situations, a small loop bandwidth is required, and for out-of-lock situations, a large loop bandwidth is required. Present-day solutions comprise means for detecting whether or not the PLL is in-lock and, based on this detection for switching between a large loop bandwidth and a small loop bandwidth, or for switching the gain of the charge pump from a low value to a high value, or vice versa. However, this provides a compromise for only two situations: in-lock and out-of-lock. In contrast, the present invention provides a continuous and adaptive control of the loop bandwidth. This means that the bandwidth is controlled as a function of the magnitude of the frequency change and/or phase error. In the embodiment of the charge pump of FIG. 7, this is automatically achieved as follows. The low-pass characteristic of a current mirror can be made a function of the current running through the mirror by placing a capacitor parallel to the input of the current mirror. As the input transistor of the current mirror exhibits an impedance which is inversely proportional to the current flowing through the transistor, a capacitor arranged parallel to this impedance causes in the current running through the transistor to undergo a low-pass filtering. As the impedance of the transistor is inversely proportional to the current, the cut-off frequency of the low-pass filter will vary in proportion with the current: a small current results in a low cut-off frequency and a large current results in a high cut-off frequency. This is especially advantageous in a phase-locked loop where a fast response to a frequency difference is required. A fast response requires a fast loop filter, i.e., a loop filter having a large bandwidth. A slow response is required for in-lock situations where only small phase errors occur, resulting in a low bandwidth for the loop filter. A low bandwidth provides extra suppression of spurious frequencies at $f_{ref}$ and its harmonics. A low bandwidth also reduces noise in the phase-locked loop. These features are automatically achieved in the present invention by providing a capacitance so as to be parallel with an input of a current mirror, which is part of the low-pass filters. This means that now a loop filter LP is obtained having a bandwidth which is a function of the phase and/or frequency difference between the input frequency and the reference frequency $f_{ref}$. In fact, this function is a non-discrete continuous function. The bandwidth is thus proportional to an averaged difference between the up- and down-pulses. The current mirror used as low-pass filter may even be a fast NPN current mirror. As a matter of fact, in the embodiment of FIG. 7, separate bandwidths for the up- and down-pulses are created as the up- and down-pulses undergo separate filtering in respective current mirrors CM1 and CM2. Here the bandwidths are a function of the width of the respective pulses.

As an alternative to the embodiment of FIG. 7, the adaptive loop bandwidth can be achieved in the following way. Means are provided for generating a control signal proportional to a magnitude of a phase/frequency error between the input frequency and the reference frequency. In FIG. 1, this would mean the addition of a box representing these means, and having an input coupled to inputs 21 and 22 and an output coupled to a control input of the loop filter LP for supplying the control signal to the loop filter LP. This control signal can be derived from the up- and down-pulses, for example, by taking the averaged difference between the up- and down-pulses. The loop filter LP now has a control input for controlling the bandwidth of the loop filter LP in response to a control signal applied to the control input. The control signal generated by the generating means is then applied to the control input. The loop filter LP may, for this purpose, comprise a parallel circuit of a variable resistance device and a capacitor. The variable resistance device may, for example, be the resistance device known from U.S. Pat. No. 5,493,250. A different way of realizing an adaptive bandwidth of the PLL is by controlling the currents of the charge pump as a function of the up- and down-pulses by supplying the last-mentioned control signal, for example, to the current sources 204 and 210, which then become controlled current sources. A combination of an adaptive charge pump as shown in FIG. 7 and an adaptive loop filter control as described previously is of course also possible.

The invention is not limited to the embodiments as shown above. For example, numerous variants of current mirrors are known, which can all be used for the current mirrors CM1 . . . CM7. The charge pump can also have only a single input for receiving a combined up/down-signal. In this case the single up/down-signal can be split into separate up- and down-signals and the two separate low-pass filters 14 and 16 can be maintained. Alternatively, the low-pass filters 14 and 16 can be combined into one filter for the circuit of FIG. 3, and current sources 10 and 12 can be combined into one current source, which must then of course be able to supply both positive and negative currents. The current mirror with a capacitance coupled parallel to its input is also generally applicable as a low-pass filter of which the cut-off frequency is a function of the magnitude of the current applied to the input.

What I claim is:

1. A charge pump for supplying, at an output, a first current in response to a first control signal, and for sinking, at the output, a second current in response to a second control signal, characterized in that the charge pump comprises:
   first means for converting the first control signal into the first current;
   second means for converting the second control signal into the second current, said first and second converting means comprising means for converting the first and second control signals into first and second control currents, respectively, and means for filtering the first and second control currents, respectively, said filtering means comprising first and second low-pass current filters in said first and second converting means, respectively; and
   means for subtracting output signals of the first and second low-pass current filters from each other, an output of said subtracting means forming the output of the charge pump.

2. The charge pump as claimed in claim 1, characterized in that the filtering means in said first and second means comprise respective low-pass filters for filtering the respective control signals, and said charge pump further comprises controlled current sources for receiving the respective filtered first and second control signals.

3. The charge pump as claimed in claim 1, characterized in that the first and second means comprise respective means for converting the first and second control signals into respective control currents, said respective control currents being applied to said filtering means of said first and second means, said filtering means comprising respective low-pass current filters, output signals of the low-pass current filters being subtracted from each other at the output of the charge pump.

4. The charge pump as claimed in claim 1, characterized in that the means for converting the first control signal into the first control current in the first converting means comprises a first differential pair for converting the first control signal, applied to inputs of the first differential pair, into a first control current, and said first low-pass current filter comprises a first current mirror for receiving said first control current, in that the means for converting the first control signal into the first control current in the second converting means comprises a second differential pair for converting the second control signal, applied to inputs of the second differential pair, into a second control current, and said second low-pass current filter comprises a second current mirror for receiving the second control current, and in that the subtracting means comprises a third current mirror for coupling an output of the second current mirror, carrying said second current, to an output of the first current mirror a carrying said first current.

5. The charge pump as claimed in claim 4, characterized in that the first and second differential pairs and the third current mirror comprise transistors of a first conductivity type, and the first and second current mirrors comprise transistors of a second conductivity type.

6. The charge pump as claimed in claim 4, characterized in that the charge pump comprises first and second capacitances placed parallel to respective inputs of the first and second current mirrors.

7. The charge pump as claimed in claim 4, characterized in that the first and second current mirrors comprise respective cascades of current mirrors, the current mirrors in each cascade alternating between a first and a second conductivity type.

8. A frequency synthesis circuit comprising:
   a phase detector having a first input for receiving an input frequency, and a second input for receiving a reference frequency;
   a charge pump coupled to the phase detector for supplying, at an output, a first current in response to a first control signal, and for sinking, at the output, a second current in response to a second control signal;
   a loop filter coupled to the charge pump; and
   a voltage controlled oscillator coupled to the loop filter for supplying the input frequency to the phase detector, characterized in that the charge pump comprises:
   first means for converting the first control signal into the first current;
   second means for converting the second control signal into the second current, said first and second converting means comprising means for converting the first and second control signals first and second control currents, respectively, and means for filtering the first and second control currents, respectively, said filtering means comprising first and second low-pass current filters in said first and second converting means, respectively; and
   means for subtracting output signals of the first and second low-pass current filters from each other, an output of said subtracting means forming the output of the charge pump.

9. A receiver comprising an RF section, a mixer stage and a signal processing section, said mixer stage receiving a mixing frequency from a frequency synthesis circuit which comprises a phase-locked loop, said phase-locked loop comprising:

a phase detector having a first input for receiving an input frequency derived from the mixing frequency, and a second input for receiving a reference frequency;

a charge pump, coupled to the phase detector, for supplying, at an output, a first current in response to a first control signal, and for sinking, at the outputs, a second current in response to a second control signal;

a loop filter coupled to the charge pump; and a voltage controlled oscillator coupled to the loop filter for supplying the mixing frequency, characterized in that the charge pump comprises:

first means for converting the first control signal into the first current;

second means for converting the second control signal into the second current, said first and second converting means comprising means for converting the first and second control signals into first and second control currents, respectively, and means for filtering the first and second control currents, respectively, said filtering means comprising first and second low-pass current filters in said first and second converting means, respectively; and means for subtracting output signals of the first and second low-pass current filters from each other, an output of said subtracting means forming the output of the charge pump.

10. A frequency synthesis circuit comprising:

a phase detector having a first input for receiving an input frequency, a second input for receiving a reference frequency, and output means;

a charge pump coupled to the output means of the phase detector, said charge pump supplying, at an output, a first current in response to a first control signal, and for sinking, at the output, a second current in response to a second control signal;

loop filter means coupled to the charge pump; and a voltage controlled oscillator coupled to the loop filter for supplying the input frequency to the phase detector, characterized in that the charge pump comprises:

first means for converting the first control signal into the first current;

second man for converting the second control signal into the second current, said first and second converting means comprising means for converting the first and second control signals into first and second control currents, respectively, and means for filtering the first and second control currents, respectively, said filtering means comprising first and second low-pass current filter in said first and second converting means, respectively; and means for subtracting output signals of the first and second low-pass current filters from each other, an output of said subtracting means forming the output of the charge pump; and the loop filter means comprises a low-pass filter portion incorporated in the filtering means of said charge pump, said low-pass filter portion having bandwidth that is a function of a phase and/or frequency difference between the input frequency and the reference frequency.

\* \* \* \* \*